(12) United States Patent
Cho et al.

(10) Patent No.: US 11,908,781 B2
(45) Date of Patent: Feb. 20, 2024

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Wei-Chih Cho, Kaohsiung (TW); Chun-Hung Yeh, Kaohsiung (TW); Tsung-Wei Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 236 days.

(21) Appl. No.: 17/209,085

(22) Filed: Mar. 22, 2021

(65) Prior Publication Data

US 2022/0301995 A1 Sep. 22, 2022

(51) Int. Cl.
*H01L 23/498* (2006.01)
*H01L 23/31* (2006.01)
*H01L 21/56* (2006.01)
*H01L 21/48* (2006.01)

(52) U.S. Cl.
CPC .... *H01L 23/49805* (2013.01); *H01L 21/4853* (2013.01); *H01L 21/565* (2013.01); *H01L 23/3128* (2013.01); *H01L 23/49838* (2013.01)

(58) Field of Classification Search
None
See application file for complete search history.

(56) References Cited

U.S. PATENT DOCUMENTS

| 2006/0261472 | A1* | 11/2006 | Kimura | H05K 1/144 257/E21.705 |
| 2010/0090322 | A1* | 4/2010 | Hedler | H01L 24/19 257/676 |
| 2016/0372445 | A1* | 12/2016 | Yiu | H01L 27/14618 |
| 2019/0074267 | A1* | 3/2019 | Yang | H01L 25/50 |
| 2020/0350180 | A1 | 11/2020 | Yen et al. | |

FOREIGN PATENT DOCUMENTS

CN 104218030 A 12/2014

* cited by examiner

*Primary Examiner* — Jay C Chang
(74) *Attorney, Agent, or Firm* — FOLEY & LARDNER LLP

(57) ABSTRACT

At least some embodiments of the present disclosure relate to a semiconductor package structure. The semiconductor package structure includes a substrate with a first surface, an encapsulant, an electronic component, and a patterned conductive layer. The encapsulant is disposed on the first surface of the substrate. The encapsulant includes a first surface and a second surface. The patterned conductive layer extends on the first surface and the second surface of the encapsulant and protrudes from the first surface and the second surface of the encapsulant. The electronic component is disposed on the patterned conductive layer.

18 Claims, 16 Drawing Sheets

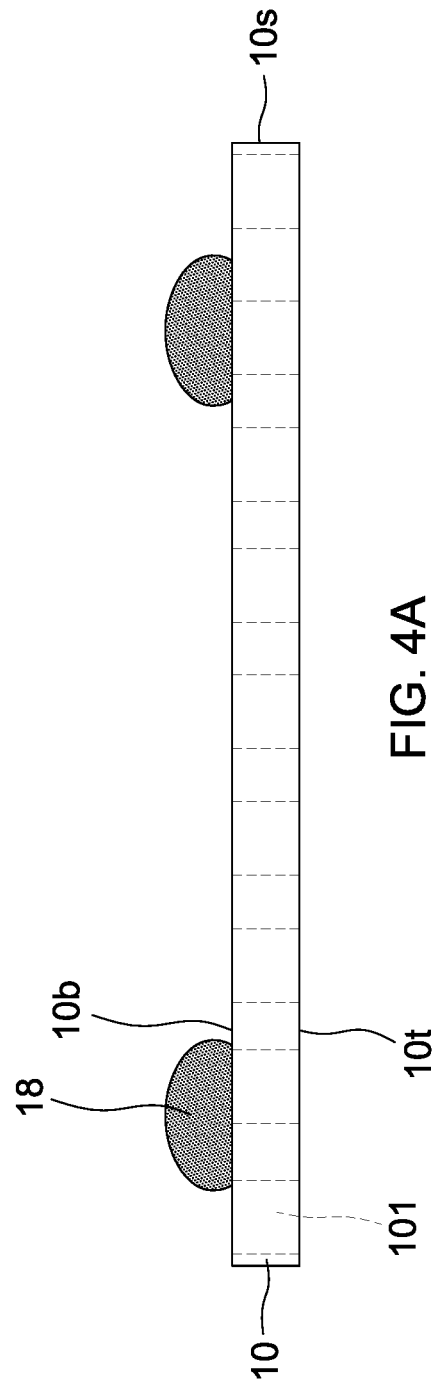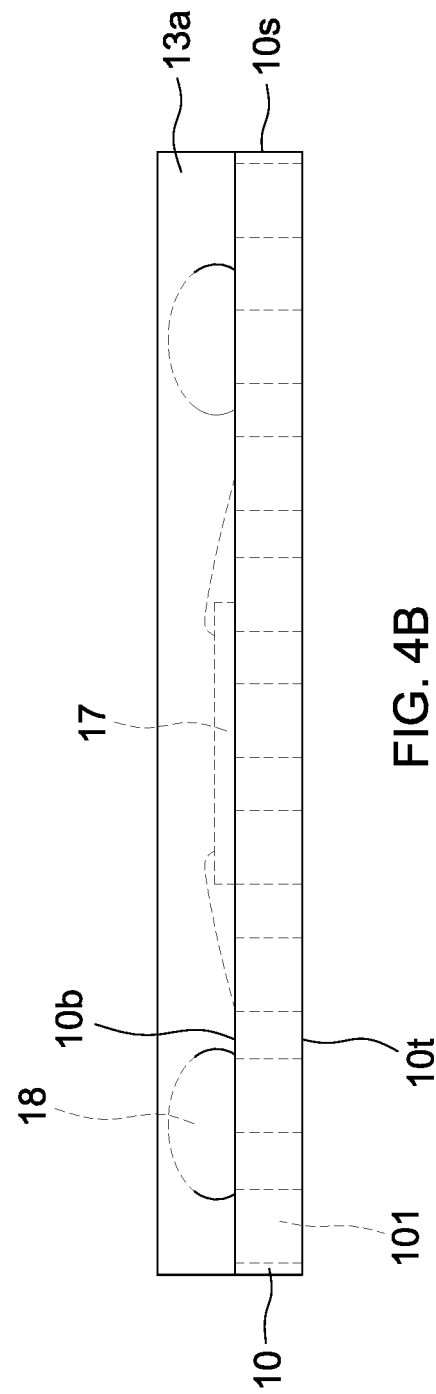

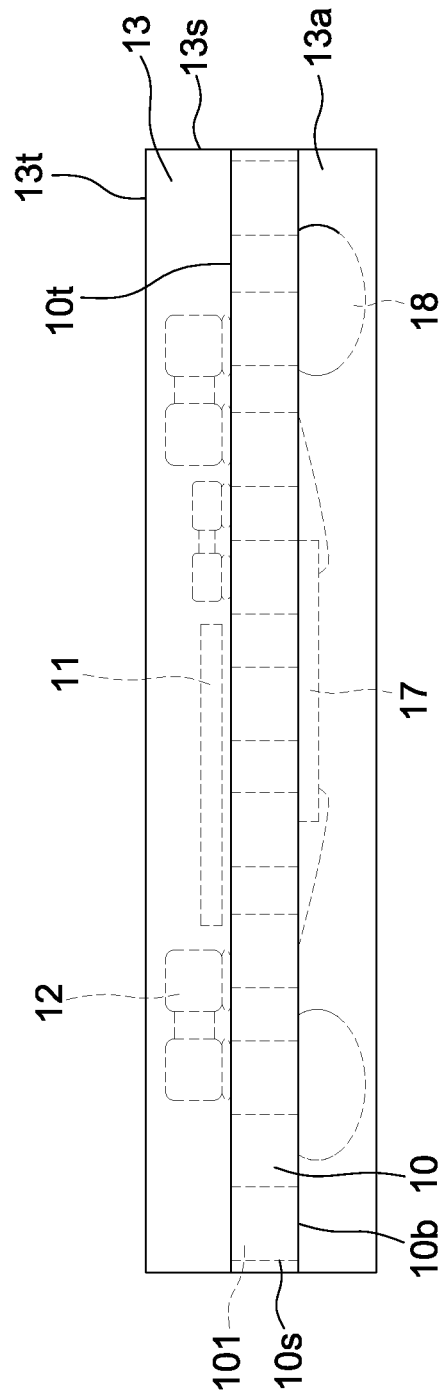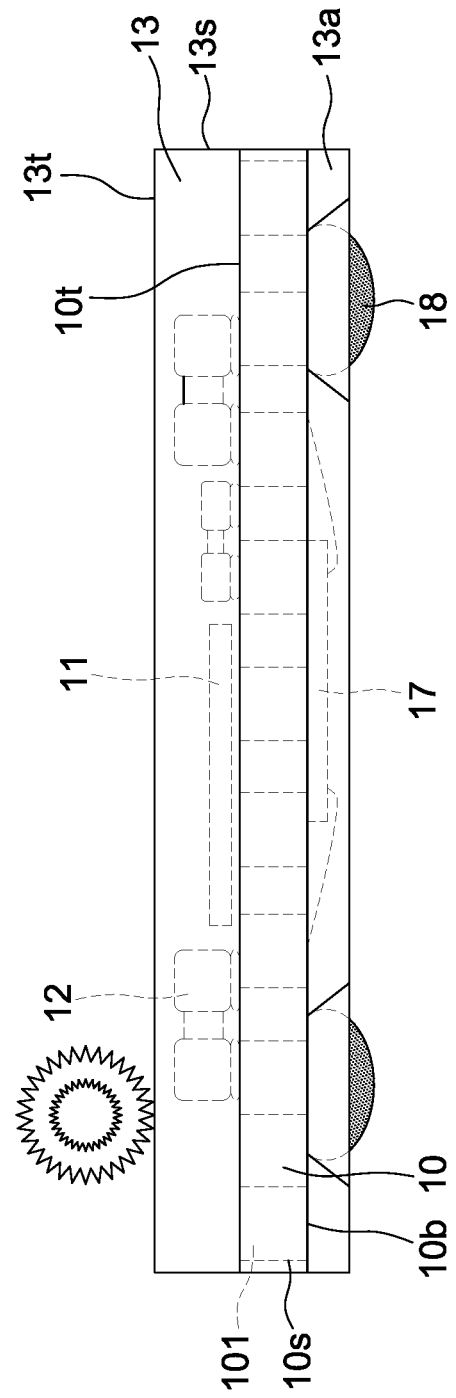

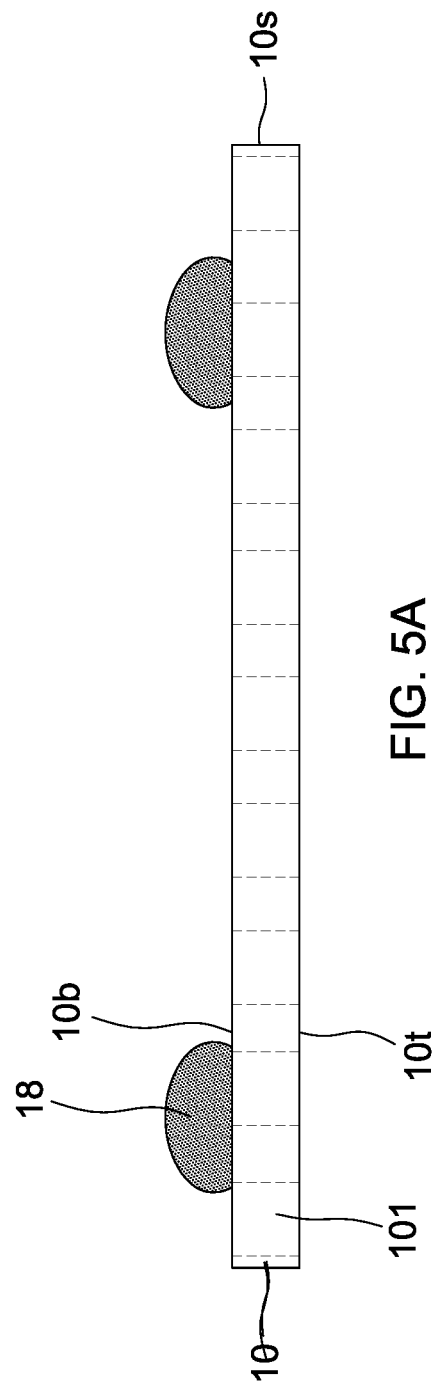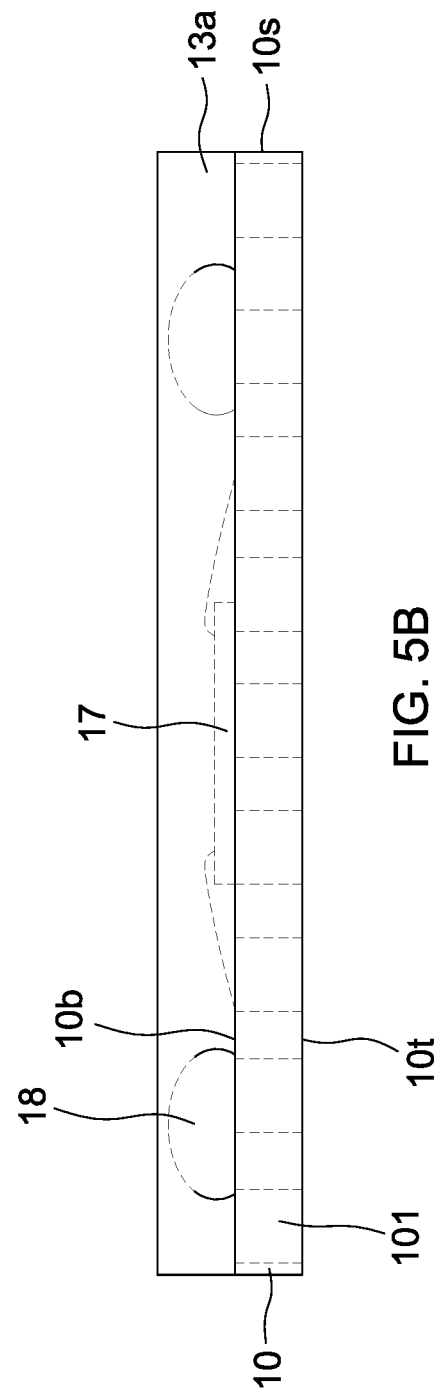

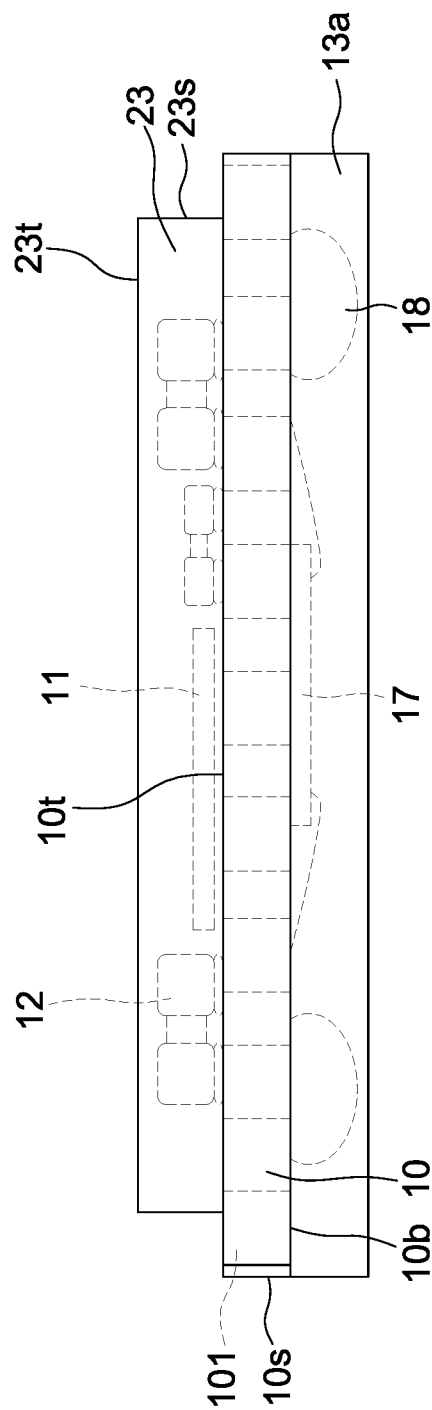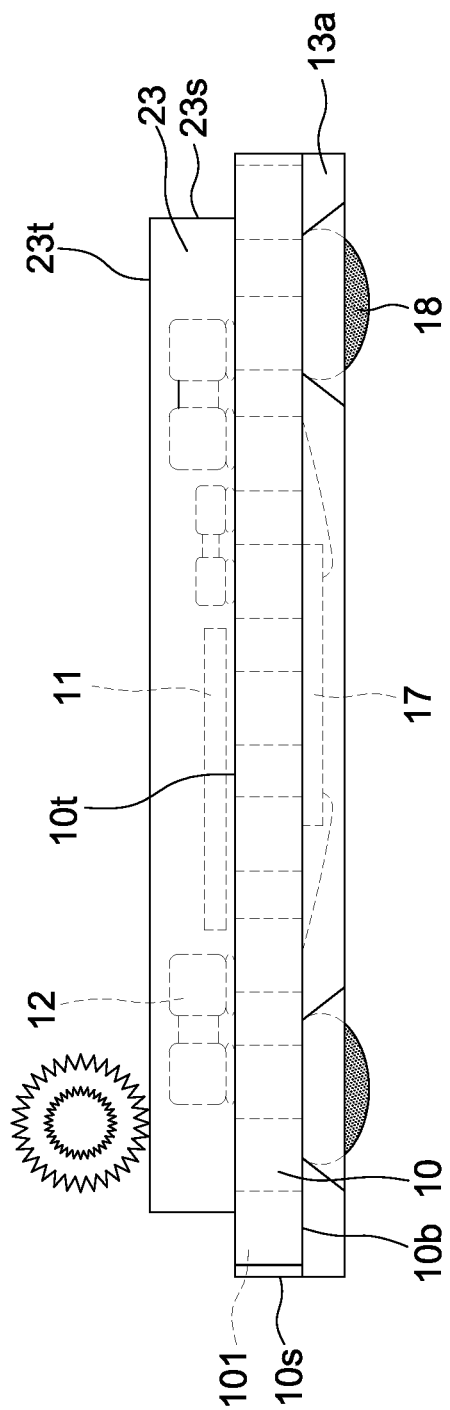

SEMICONDUCTOR DEVICE PACKAGE AND A METHOD OF MANUFACTURING THE SAME

BACKGROUND

1. Technical Field

The present disclosure relates to a semiconductor device package. More particularly, the present disclosure relates to a semiconductor device package having a stacked structure.

2. Description of the Related Art

In a 3D package structure, interposers, solder balls, or pillars embedded in an encapsulant are used as a conductive path for transmitting signals in a Z direction (height direction). However, the interposers, solder balls, and pillars occupy a relatively large surface area of a substrate of the 3D package structure. Accordingly, it is difficult to decrease the size/dimension of the 3D package structure. As miniaturization of semiconductor device packages progresses, it is challenging to control the size/dimension of the interposers, solder balls, and pillars so as to improve usage of the surface area of the substrate.

SUMMARY

In some embodiments, according to one aspect, a semiconductor package structure includes a substrate with a first surface, an encapsulant, a patterned conductive layer, and an electronic component. The encapsulant is disposed on the first surface of the substrate. The encapsulant includes a first surface and a second surface. The patterned conductive layer extends on the first surface and the second surface of the encapsulant and protrudes from the first surface and the second surface of the encapsulant. The electronic component is disposed on the patterned conductive layer.

In some embodiments, according to another aspect, a semiconductor package structure includes a substrate with a top surface and a bottom surface opposite the top surface, a first electronic component, a first encapsulant, a patterned conductive layer, a second electronic component, a third electronic component, and a second encapsulant. The first electronic component is disposed on the top surface of the substrate. The first encapsulant is disposed on the top surface of the substrate and encapsulates the first electronic component. The first encapsulant includes a top surface and a lateral surface angled to the top surface of the first encapsulant. The patterned conductive layer extends on the top surface and the lateral surface of the first encapsulant. The second electronic component is disposed on the patterned conductive layer. The third electronic component is disposed on the bottom surface of the substrate. The second encapsulant is disposed on the bottom surface of the substrate and encapsulating the third electronic component. The first electronic component, the second electronic component, and the third electronic component are electrically connected to one another through the patterned conductive layer.

In some embodiments, according to another aspect, a method is disclosed for manufacturing a semiconductor package structure. The method includes: providing a device, the device comprising a substrate, an encapsulant, and a conductive layer, wherein the substrate includes a top surface and a lateral surface angled to the top surface, the encapsulant is disposed on the top surface of the substrate, and the conductive layer is disposed on encapsulant; and patterning the conductive layer on a lateral surface of the encapsulant to form a patterned conductive layer.

BRIEF DESCRIPTION OF THE DRAWINGS

FIG. 4A illustrates a method of manufacturing a semiconductor package structure according to some embodiments of the present disclosure.

FIG. 4B illustrates a method of manufacturing a semiconductor package structure according to some embodiments of the present disclosure.

FIG. 4C illustrates a method of manufacturing a semiconductor package structure according to some embodiments of the present disclosure.

FIG. 4D illustrates a method of manufacturing a semiconductor package structure according to some embodiments of the present disclosure.

FIG. 5A illustrates a method of manufacturing a semiconductor package structure according to some embodiments of the present disclosure.

FIG. 5B illustrates a method of manufacturing a semiconductor package structure according to some embodiments of the present disclosure.

FIG. 5C illustrates a method of manufacturing a semiconductor package structure according to some embodiments of the present disclosure.

FIG. 5D illustrates a method of manufacturing a semiconductor package structure according to some embodiments of the present disclosure.

DETAILED DESCRIPTION

Figure 1A:
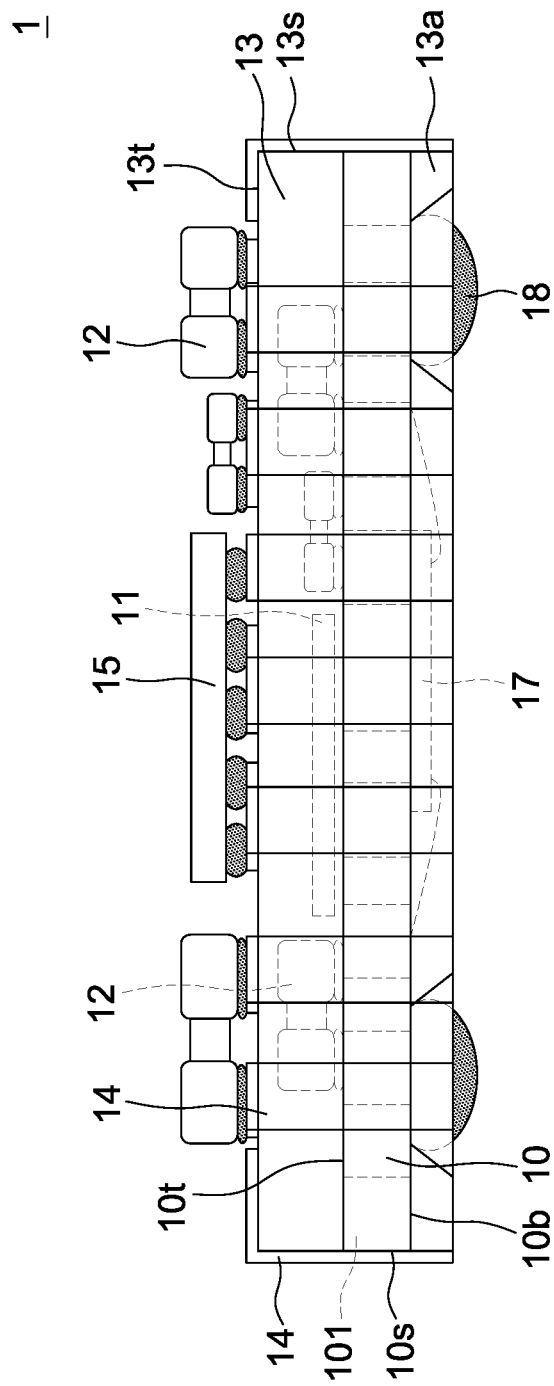
FIG. 1A illustrates a front view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of the embodiments of this disclosure are not deviated from by such arrangement.

FIG. 1A is a front view of a semiconductor package structure 1 in accordance with some embodiments of the present disclosure. The semiconductor package structure 1 includes a substrate 10, an electronic component 11, an electronic component 12, an encapsulant 13, an encapsulant 13a, a patterned conductive layer 14, an electronic component 15, an electronic component 17, and an electrical contact 18. The semiconductor package structure 1 may be a double-sided molding structure. Alternatively, the semiconductor package structure 1 may be a single-sided structure.

The substrate 10 includes a top surface 10t, a bottom surface 10b opposite the top surface 10t, and a lateral surface 10s connecting the top surface 10t to the bottom surface 10b. The lateral surface 10s is angled to the top surface 10t or the bottom surface 10b. The lateral surface 10s may be substantially perpendicular to the top surface 10t or the bottom surface 10b. The substrate 10 includes a conductive element 101. The conductive element 101 may be a conductive via or an interconnection element. The conductive element 101 may be a conductive layer adjacent to the top surface 10t, the bottom surface 10b, or the lateral surface 10s.

In some embodiments, the substrate 10 may be or include, for example, a printed circuit board, such as a paper-based copper foil laminate, a composite copper foil laminate, or a polymer-impregnated glass-fiber-based copper foil laminate. The substrate 10 may include a core layer which is made of a bismaleimide-triazine (BT) resin or a glass-reinforced epoxy composite (e.g., an FR-4 composite). The substrate 10 may include an interconnection structure, such as a redistribution layer (RDL) or a grounding element. In some embodiments, the grounding element is a via that is exposed from a lateral surface of the substrate 10. In some embodiments, the grounding element is a metal layer exposed from the lateral surface of the substrate 10. In some embodiments, the grounding element is a metal trace exposed from the lateral surface of the substrate 10. The substrate 10 may include a conductive pad or a conducive trace.

The electronic component 11 and the electronic component 12 are disposed on the top surface 10t of the substrate 10. The electronic component 11 may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. The electronic component 11 is a flip-chip type semiconductor device. The electronic component 11 may include conductive pads electrically connected to the conductive element 101 of the substrate 10. In some embodiments, the electronic component 11 may be a wire-bond type semiconductor device. The electronic component 12 is a passive device such as a resistor, a capacitor, an inductor, or a combination thereof.

The electronic component 11 is electrically connected to the substrate 10. The electronic component 11 may be in contact with the conductive element 101 of the substrate 10. The electronic component 12 is electrically connected to the substrate 10. The electronic component 12 may be in contact with the conductive element 101 of the substrate 10. The electronic component 11 may be electrically connected to the electronic component 12 through the substrate 10 (e.g., through the interconnection structure of the substrate 10).

The encapsulant 13 is disposed on the top surface 10t of the substrate 10. The encapsulant 13 includes a top surface 13t and a lateral surface 13s angled to the top surface 13t. The top surface 13t may be substantially perpendicular to the lateral surface 13s. The encapsulant 13 entirely covers the top surface 10t of the substrate 10. The top surface 13t of the encapsulant 13 is substantially parallel to the top surface 10t of the substrate 10. The lateral surface 13s of the encapsulant 13 and the lateral surface 10s of the substrate 10 are substantially coplanar with each other. The encapsulant 13 encapsulates the electronic components 11 and 12. In some embodiments, there are no conductive pillars in the encapsulant 13. For example, there are no conductive pillars connecting the substrate 10 with the electronic component 12 or 15. In some embodiments, a conductive pillar may be disposed in the encapsulant 13 based on need. In some embodiments, the encapsulant 13 includes an epoxy resin having fillers dispersed therein.

The patterned conductive layer 14 is disposed on the encapsulant 13. The patterned conductive layer 14 is disposed and extends on the top surface 13t of the encapsulant 13. The patterned conductive layer 14 protrudes from the top surface 13t of the encapsulant 13. The patterned conductive layer 14 may in contact with the top surface 13t of the encapsulant 13. The patterned conductive layer 14 is disposed and extends on the lateral surface 13s of the encapsulant 13. The patterned conductive layer 14 protrudes from the lateral surface 13s of the encapsulant 13. The patterned conductive layer 14 may in contact with the lateral surface 13s of the encapsulant 13. The patterned conductive layer 14 is disposed and extends on the lateral surface 10s of the substrate 10. The patterned conductive layer 14 protrudes from the lateral surface 10s of the substrate 10. The patterned conductive layer 14 is electrically connected to the conductive element 101 of the substrate 10. For example, patterned conductive layer 14 may be electrically connected to the interconnection structure exposed from the substrate 10. The patterned conductive layer 14 may in contact with the lateral surface 10s of the substrate 10.

The patterned conductive layer 14 extends on an outermost surface of the encapsulant 13. The patterned conductive layer 14 is in contact with the outermost surface of the encapsulant 13. The patterned conductive layer 14 extends on an outermost surface of the substrate 10. The patterned conductive layer 14 is in contact with the outermost surface of the substrate 10. In some embodiments, the patterned conductive layer 14 may be in contact with three outermost surfaces of the encapsulant 13. The three outermost surfaces of the encapsulant 13 include two lateral surfaces and one top surface. The patterned conductive layer 14 may be in contact with two outermost surfaces of the substrate 10. The two outermost surfaces of the substrate 10 are lateral surfaces. In some embodiments, the patterned conductive layer 14 may be in contact with five outermost surfaces of the encapsulant 13. The five outermost surfaces of the encapsulant 13 include four lateral surfaces and one top surface. The patterned conductive layer 14 may be in contact with four outermost surfaces of the substrate 10. The four outermost surfaces of the substrate 10 are lateral surfaces.

The patterned conductive layer 14 extends from the top surface 13t of the encapsulant 13 to the lateral surface 10s of the substrate 10. In some embodiments, the patterned conductive layer 14 may extend from the top surface 13t of the encapsulant 13 to a lateral surface of the encapsulant 13a. The patterned conductive layer 14 extends from the top surface 13t of the encapsulant 13 to the bottom surface 10b of the substrate 10. The patterned conductive layer 14 extends on the lateral surface 13s of the encapsulant 13 and the lateral surface 10s of the substrate 10. The patterned conductive layer 14 extends on the lateral surface 13s of the encapsulant 13, the lateral surface 10s of the substrate 10, and the lateral surface of the encapsulant 13a. A bottom surface of the patterned conductive layer 14 and a bottom surface of the encapsulant 13a may be substantially coplanar with each other.

In some embodiments, the patterned conductive layer 14 has only one surface in contact with the top surface 13t of the encapsulant 13. For example, a portion of the patterned conductive layer 14 disposed on the top surface 13t of the encapsulant 13 has a bottom surface in contact with the top surface 13t of the encapsulant 13 while a top surface and lateral surfaces of the patterned conductive layer 14 are spaced apart from the top surface 13t of the encapsulant 13. In some embodiments, the patterned conductive layer 14 has only one surface in contact with the lateral surface 13s of the encapsulant 13. For example, a portion of the patterned conductive layer 14 disposed on the lateral surface 13s of the encapsulant 13 has a bottom surface in contact with the top surface 13t of the encapsulant 13 while a top surface and lateral surfaces of the patterned conductive layer 14 are spaced apart from the lateral surface 13s of the encapsulant 13. In some embodiments, the patterned conductive layer 14 has only one surface in contact with the lateral surface 10t of the substrate 10. For example, a portion of the patterned conductive layer 14 disposed on the lateral surface 10t of the substrate 10 has a bottom surface in contact with the lateral surface 10t of the substrate 10 while a top surface and lateral surfaces of the patterned conductive layer 14 are spaced apart from the lateral surface 10t of the substrate 10.

In some embodiments, the patterned conductive layer 14 may include aluminum (Al), copper (Cu), chromium (Cr), tin (Sn), gold (Au), silver (Ag), nickel (Ni) or stainless steel, or a mixture, an alloy, or other combination thereof. The patterned conductive layer 14 may be a physical vapor deposition-deposited (PVD-deposited) conductive layer. The patterned conductive layer 14 may be a sputtered metal layer. The patterned conductive layer 14 may be a sputtered Cu layer.

A pitch of the patterned conductive layer 14 on the top surface 13t of the encapsulant 13 is equal to or greater than a pitch of a conductive layer of the substrate 10 adjacent to the top surface 10t of the substrate 10. The pitch of the patterned conductive layer 14 on the lateral surface 13s of the encapsulant 13 is equal to or greater than a pitch of the conductive layer of the substrate 10 adjacent to the lateral surface 10s of the substrate 10. The conductive layer of the substrate 10 may be electrically connected to the electronic component 11. Wafer level chip scale package (WLCSP) devices, ball grid array (BGA) devices, land grid array (LGA) devices, or passive devices may be mounted on and electrically connected to the patterned conductive layer 14.

The electronic component 15 and the electronic component 12 are disposed on the top surface 13t of the encapsulant 13. The electronic component 15 and the electronic component 12 are disposed on the patterned conductive layer 14. The electronic component 15 and the electronic component 12 are in contact with and electrically connected to the patterned conductive layer 14. The electronic component 15 and the electronic component 12 are disposed on the patterned conductive layer 14. In some embodiments, the electronic components 12 and 15 on the encapsulant 13 are electrically connected to the patterned conductive layer 14. The electronic component 12 or 15 is electrically connected to the substrate 10, the electronic component 11, and/or the electronic component 12 on the substrate 10 through the patterned conductive layer 14. The electronic component 15 is electrically connected to the substrate 10 through the patterned conductive layer 14. In some embodiments, the patterned conductive layer 14 may include a plurality of separate portions respectively connected to individual electrical contacts (e.g., output terminals or output pins) of the electronic component 12 or 15. The electronic component 15 may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, a type of the electronic component 15 may be the same as or different from that of the electronic component 11.

The electronic component 17 is disposed on the bottom surface 10b of the substrate 10. The electronic component 17 may include a chip or a die including a semiconductor substrate, one or more integrated circuit devices and/or one or more overlying interconnection structures therein. The electronic component 17 is electrically connected to the conductive element 101 of the substrate 10 through wire bonding or flip-chip technique. The electronic component 17 is electrically connected to the patterned conductive layer 14. In some embodiments, a type of the electronic component 17 may be the same as or different from that of the electronic component 11.

The encapsulant 13a is disposed on the bottom surface 10b of the substrate 10. The encapsulant 13b encapsulates the electronic component 17. In some embodiments, the encapsulant 13b includes an epoxy resin having fillers dispersed therein.

The electrical contact 18 (e.g. a solder ball) is disposed on the bottom surface 10b of the substrate 10 and can provide electrical connections between the semiconductor package device 1 and external components (e.g. external circuits or circuit boards). In some embodiments, the electrical contact 18 includes a controlled collapse chip connection (C4) bump, a ball grid array (BGA) or a land grid array (LGA).

In some embodiments, signal transmission between the electronic component (e.g., the electronic components 12 and 15) on the encapsulant 13 and the substrate 10 can be achieved through conductive pillars, solder balls, or interposers embedded within the encapsulant 13. However, the interposers, solder balls, and pillars occupy a relatively large surface area of the substrate 10, which would hinder miniaturization of the semiconductor device package 1.

In accordance with the embodiments as shown in FIG. 1A, the signal transmission between the electronic component (e.g., the electronic components 12 and 15) on the encapsulant 13 and the substrate 10 can be achieved through the patterned conductive layer 14, and thus the interconnection structures (e.g., the interposers, solder balls, and pillars) embedded within the encapsulant 13 can be omitted. Since the size of the patterned conductive layer 14 is relatively small, the area of the semiconductor package structure 1 can be reduced. On the other hand, since interposers, solder balls, or pillars embedded in the encapsulant 13 are not utilized by the semiconductor package structure 1, more surface area of the top surface 10t of the substrate 10 can be acquired to accommodate more electronic components. Also, a shape of the patterned conductive layer 14 may be easily adjusted by, for example, a laser polishing operation such that circuit designs for the semiconductor package structure 1 would be more flexible.

Figure 1B:
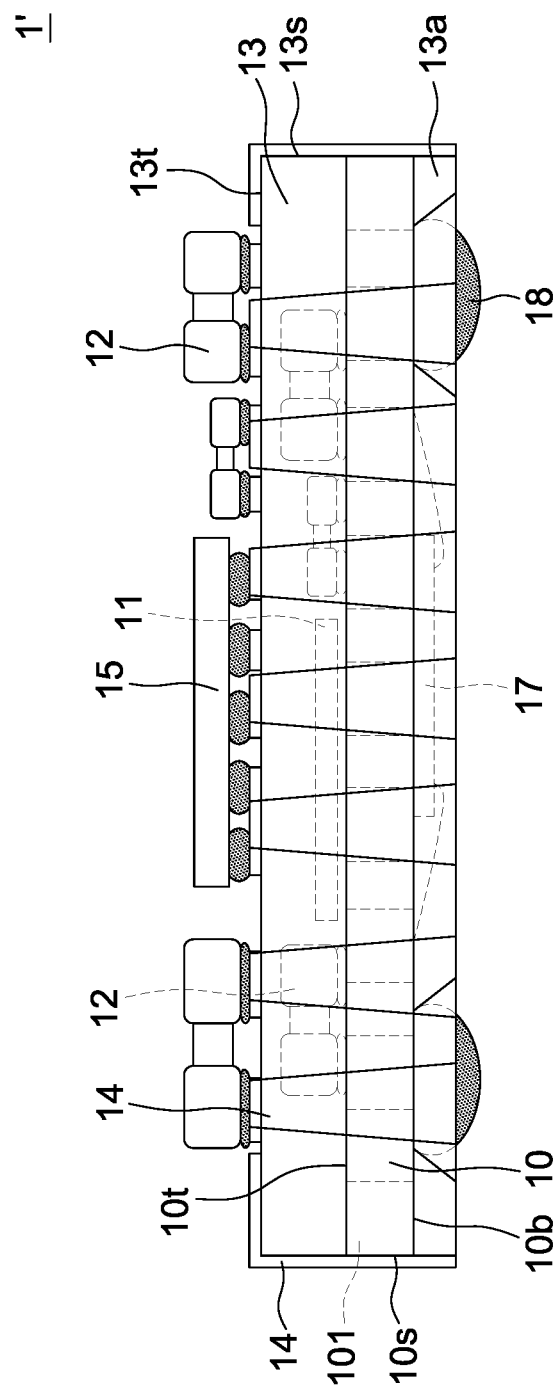
FIG. 1B illustrates a front view of a semiconductor package structure according to some embodiments of the present disclosure.

FIG. 1B is a front view of a semiconductor package structure 1' in accordance with some embodiments of the present disclosure. The semiconductor package structure 1' is similar to the semiconductor package structure 1 in FIG. 1A except that the patterned conductive layer 14 extending on the lateral surface 13s of the encapsulant 13 and the lateral surface 10s of the substrate 10 comprises a tapered shape.

A portion of the patterned conductive layer 14 extending on the lateral surface 13s of the encapsulant 13 comprises a tapered shape. A portion of the patterned conductive layer 14 extending on the lateral surface 10s of the substrate 10 comprises a tapered shape. The tapered shape of the patterned conductive layer 14 may be formed or adjusted during a laser polishing operation.

Figure 2B:
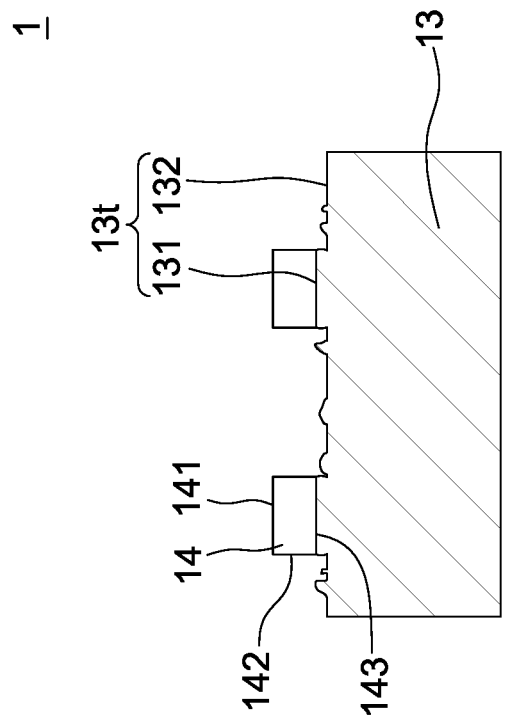
FIG. 2B illustrates a cross-sectional view of a semiconductor package structure according to some embodiments of the present disclosure.
Figure 2A:
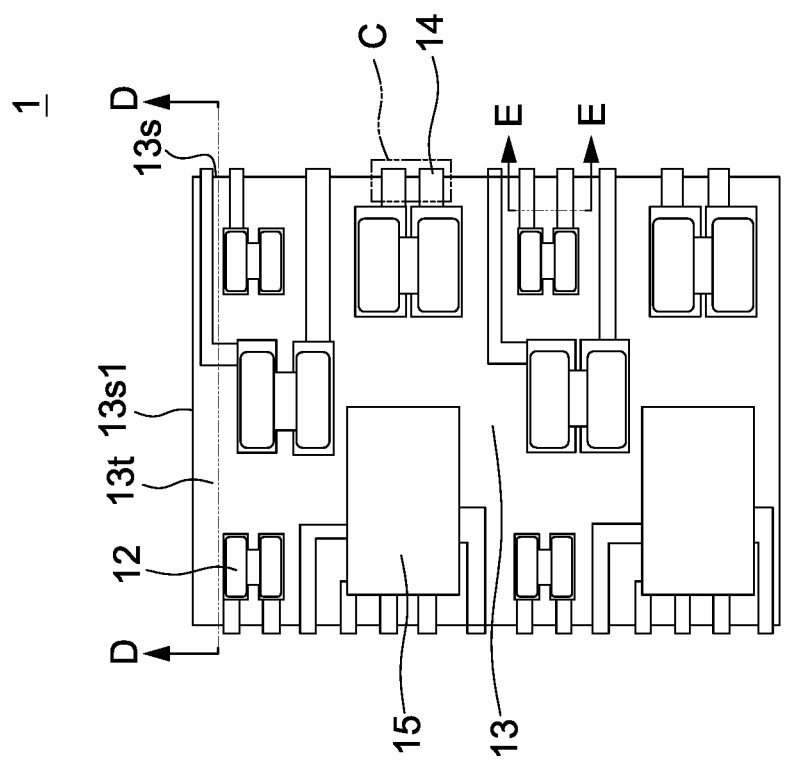
FIG. 2A illustrates a top view of a semiconductor package structure according to some embodiments of the present disclosure.

FIG. 2A is a top view of a semiconductor package structure 1 in accordance with some embodiments of the present disclosure.

The encapsulant 13 includes a lateral surface 13s1. The lateral surface 13s1 of the encapsulant 13 is angled to the top surface 13t and the lateral surface 13s of the encapsulant 13. The lateral surface 13s1 of the encapsulant 13 may be substantially perpendicular to the top surface 13t and the lateral surface 13s of the encapsulant 13. The lateral surface 13s1 of the encapsulant 13 connects to the top surface 13t and the lateral surface 13s of the encapsulant 13. The lateral surface 13s1 of the encapsulant 13 may connect to a bottom surface of the encapsulant 13. The lateral surface 13s1 of the encapsulant 13 may be a sawed surface. In some embodiments, a filler or a sawed filler in the encapsulant 13 may be exposed from the encapsulant 13.

The patterned conductive layer 14 is disposed on the top surface 13t of the encapsulant 13. The patterned conductive layer 14 is disposed on the lateral surface 13s of the encapsulant 13. The patterned conductive layer 14 extends from the top surface 13t of the encapsulant 13 to the lateral surface 13s of the encapsulant 13. The patterned conductive layer 14 may be in contact with the electronic component 12 or 15. The patterned conductive layer 14 constitutes at least two separate conductive paths on the top surface 13t and the lateral surface 13s of the encapsulant 13.

FIG. 2B is a cross-sectional view of a semiconductor package structure 1 across line B-B shown in FIG. 2A in accordance with some embodiments of the present disclosure.

The patterned conductive layer 14 includes a top surface 141 and a bottom surface 143 opposite the top surface 141. The patterned conductive layer 14 further includes a lateral surface 142 angled to the top surface 141 or the bottom surface 143. The lateral surface 142 may be perpendicular to the top surface 141 or the bottom surface 143. The bottom surface 143 of the patterned conductive layer 14 is in contact with the encapsulant 13. In some embodiments, the bottom surface 143 of the patterned conductive layer 14 is in contact with the substrate 10. The other surfaces of the patterned conductive layer 14 are spaced apart from the encapsulant 13 and/or the substrate 10. Only one surface (i.e., the bottom surface 143) of the patterned conductive layer 14 is in contact with the encapsulant 13.

A surface roughness (Ra) of the lateral surface 142 of the patterned conductive layer 14 is greater than a surface roughness of the top surface 141 of the patterned conductive layer 14. This is because the lateral surface 142 of the patterned conductive layer 14 may be damaged during a laser polishing operation. A surface roughness of the bottom surface 143 of the patterned conductive layer 14 is substantially equal to the surface roughness of the top surface 141 of the patterned conductive layer 14.

The top surface 13t of the encapsulant 13 includes a first portion 131 and a second portion 132. The first portion 131 is covered by the patterned conductive layer 14. The second portion 132 is exposed from the patterned conductive layer 14. A surface roughness of the second portion 132 of the top surface 13t of the encapsulant 13 is greater than a surface roughness of the first portion 131 of the top surface 13t of the encapsulant 13. This is because the second portion 132 of the top surface 13t of the encapsulant 13 may be damaged during a laser polishing operation. The second portion 132 of the first surface 13t of the encapsulant 13 is recessed from the first portion 131 of the first surface 13t of the encapsulant 13 by a distance in a range from approximately 5 µm to approximately 10 µm. In some embodiments, the second portion 132 of the first surface 13t of the encapsulant 13 is an irregular or uneven surface or plane.

A surface roughness of the lateral surface 13s1 of the encapsulant 13 is greater than the surface roughness of the second portion 132 of the top surface 13t of the encapsulant 13.

Figure 2D:
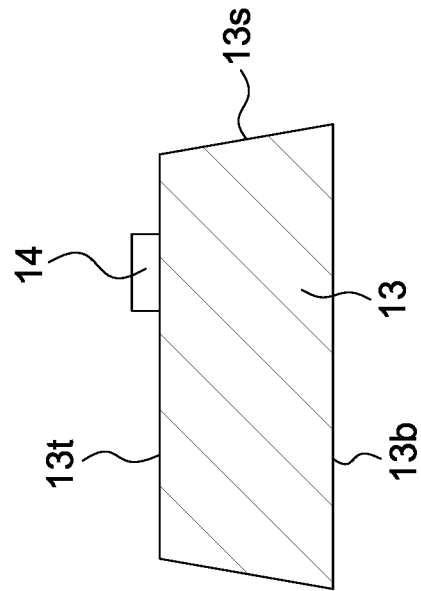
FIG. 2D illustrates a cross-sectional view of a semiconductor package structure according to some embodiments of the present disclosure.
Figure 2C:
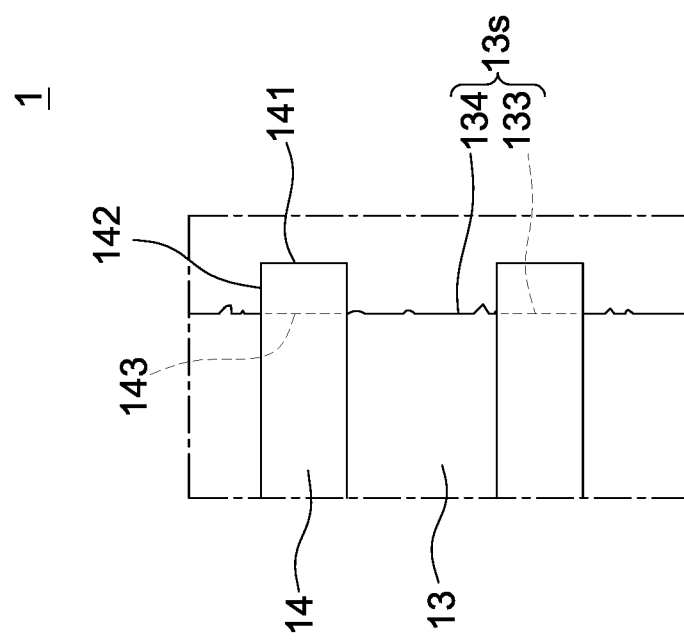
FIG. 2C illustrates a top view of a semiconductor package structure according to some embodiments of the present disclosure.

FIG. 2C is a top view of a semiconductor package structure 1 in accordance with some embodiments of the present disclosure.

The bottom surface 143 of the patterned conductive layer 14 is in contact with the top surface 13t and the lateral surface 13s of the encapsulant 13. The top surface 141 and the lateral surface 142 of the patterned conductive layer 14 are spaced apart from the encapsulant 13. The top surface 141 and the lateral surface 142 of the patterned conductive layer 14 may be exposed to air. Only one surface (i.e., the bottom surface 143) of the patterned conductive layer 14 is in contact with the encapsulant 13.

The patterned conductive layer 14 has two lateral surfaces 142 angled to the lateral surface 13s of the encapsulant 13. The lateral surfaces 142 may be perpendicular to the lateral surface 13s of the encapsulant 13. The lateral surfaces 142 of the patterned conductive layer 14 are spaced apart from the encapsulant 13.

The lateral surface 13s of the encapsulant 13 has a first portion 133 covered by the patterned conductive layer 14 and a second portion 134 exposed from the patterned conductive layer 14. A surface roughness of the second portion 134 of the lateral surface 13s of the encapsulant 13 is greater than a surface roughness of the first portion 133 of the lateral surface 13s of the encapsulant 13. The surface roughness of the lateral surface 13s1 of the encapsulant 13 is greater than the surface roughness of the second portion 134 of the lateral surface 13s of the encapsulant 13.

FIG. 2D is a cross-sectional view of a semiconductor package structure 1 taken along line D-D as shown in FIG. 2A in accordance with some embodiments of the present disclosure.

The lateral surface 13s of the encapsulant 13 may be an inclined surface resulting from a laser polishing operation. The lateral surface 13s of the encapsulant 13 and a bottom surface 13b of the encapsulant 13 form an angle.

Figure 2E:
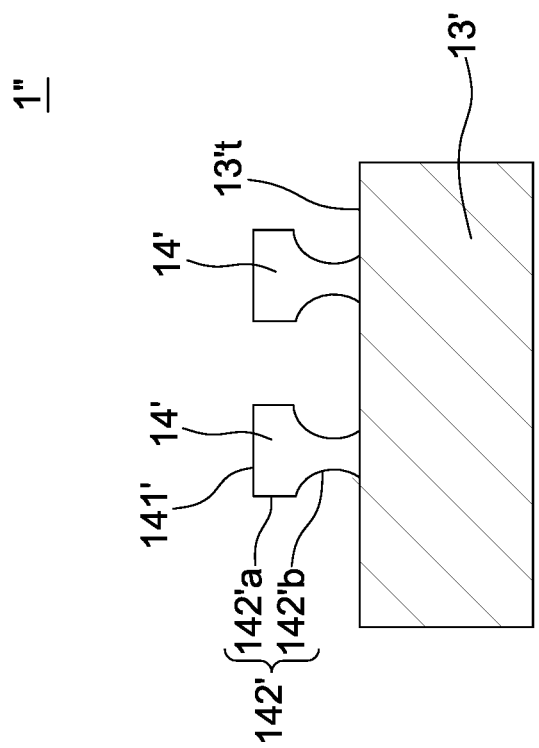
FIG. 2E illustrates a cross-sectional view of a semiconductor package structure according to some embodiments of the present disclosure.

FIG. 2E is a cross-sectional view of a semiconductor package structure 1 across line E-E shown in FIG. 2A in accordance with some embodiments of the present disclosure. The semiconductor package structure 1" is similar to the semiconductor package structure 1 in FIG. 2B except that a top surface 13't of the encapsulant 13' is not damaged during an etching operation, and that the patterned conductive layer 14' includes a lateral surface 142' with a curved shape. In addition, a lateral surface of the encapsulant 13' is not damaged during the etching operation.

Since the patterned conductive layer 14' is formed during the etching operation rather than a laser operation, the lateral surface 142' of the patterned conductive layer 14' has a first portion 142'a and a second portion 142'b. The second portion 142'b includes a curved shape resulting from the etching operation.

Figure 3A:
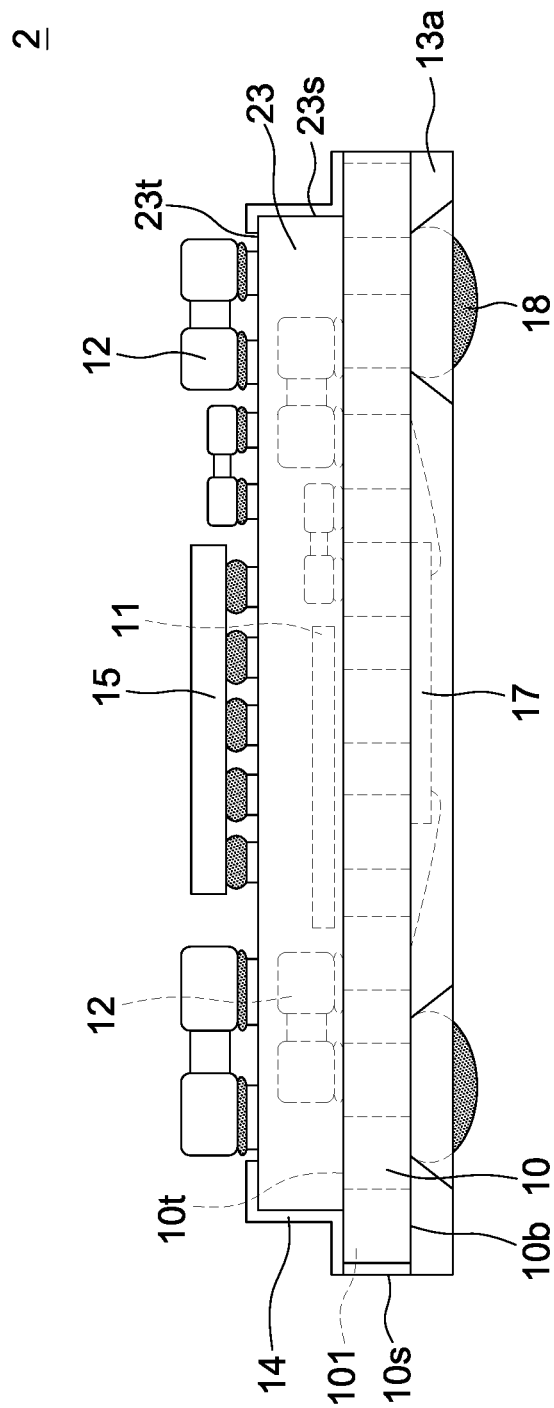
FIG. 3A illustrates a front view of a semiconductor package structure according to some embodiments of the present disclosure.

FIG. 3A is a front view of a semiconductor package structure 2 in accordance with some embodiments of the present disclosure. The semiconductor package structure 2 is similar to the semiconductor package structure 1 in FIG. 1A except that an encapsulant 23 partially covers the top surface 10t of the substrate 10, and that the patterned conductive layer 14 extends on a top surface 23t and a lateral surface 23s of the encapsulant 23 and the top surface 10t of the substrate 10. The semiconductor package structure 2 may be a strip-type structure.

The patterned conductive layer 14 may extend on the left side and the right side of the encapsulant 23. The patterned conductive layer 14 may be in contact with three outermost surfaces of the encapsulant 23. The three outermost surfaces of the encapsulant 23 include two lateral surfaces and one top surface. The patterned conductive layer 14 may be in contact with one outermost surface of the substrate 10. The one outermost surface of the substrate 10 is the top surface 10t. The lateral surface 10s of the substrate 10 is exposed to air.

Figure 3B:
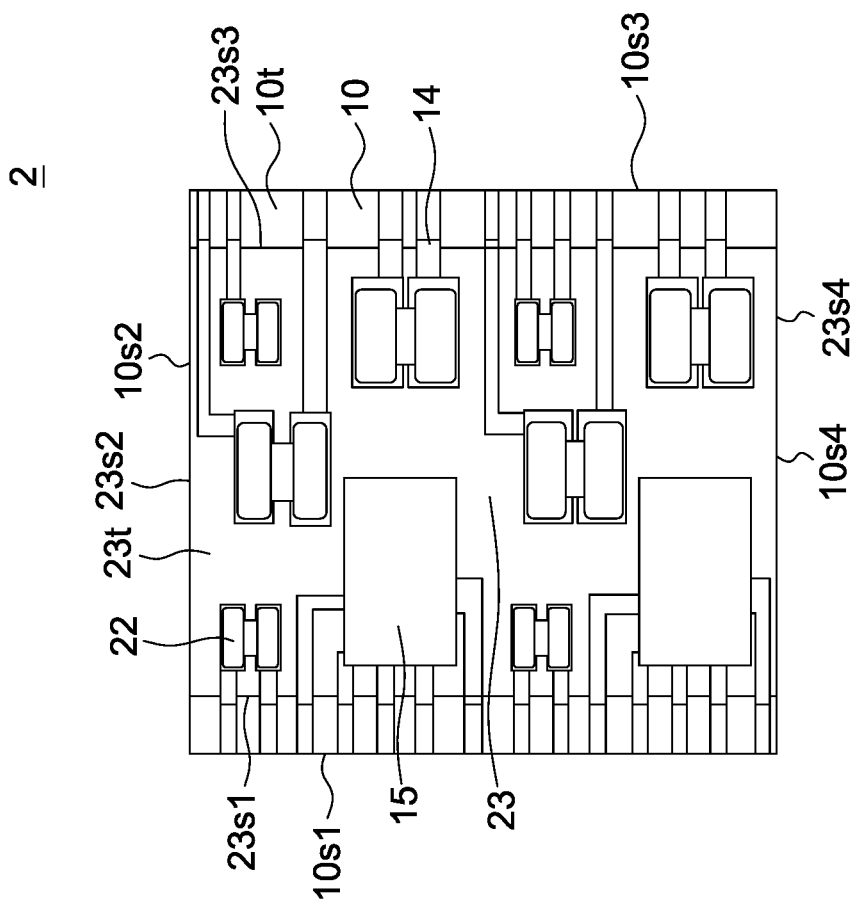
FIG. 3B illustrates a top view of a semiconductor package structure according to some embodiments of the present disclosure.

FIG. 3B is a top view of a semiconductor package structure 2 as shown in FIG. 3A, in accordance with some embodiments of the present disclosure.

The encapsulant 23 includes lateral surfaces 23s1, 23s2, 23s3, 23s4. The lateral surfaces 23s1, 23s2, 23s3, 23s4 of the encapsulant 23 are angled to the top surface 23t of the encapsulant 23. The lateral surfaces 23s1, 23s2, 23s3, 23s4 of the encapsulant 23 may be substantially perpendicular to the top surface 23t of the encapsulant 23. Each lateral surface of the encapsulant 23 connects to the top surface 23t and the other lateral surface of the encapsulant 23. The lateral surfaces 23s1 and 23s3 of the encapsulant 23 are exposed by the patterned conductive layer 14. The lateral surfaces 23s2 and 23s4 of the encapsulant 23 may be a sawed surface. For example, the lateral surfaces 23s2 and 23s4 of the encapsulant 23 may be formed via a cutting operation. In some embodiments, a filler or a sawed filler in the encapsulant 23 may be exposed from the encapsulant 23. A top surface 10t of the substrate 10 is exposed by the patterned conductive layer 14. The top surface 10t of the substrate 10 is partially exposed by the encapsulant 23.

The substrate 10 includes lateral surfaces 10s1, 10s2, 10s3, 10s4. The lateral surface 10s1 of the substrate 10 is spaced from the lateral surfaces 23s1 of the encapsulant 23 by a distance. The lateral surface 10s3 of the substrate 10 is spaced from the lateral surfaces 23s3 of the encapsulant 23 by a distance. In some embodiments, the lateral surface 10s2 of the substrate 10 may be spaced from the lateral surfaces 23s2 of the encapsulant 23 by a distance. The lateral surface 10s4 of the substrate 10 may be spaced from the lateral surfaces 23s4 of the encapsulant 23 by a distance. Under the circumstance that the top surface 10t of the substrate 10 is exposed by the encapsulant 23, a space in the encapsulant 23 for accommodating semiconductor devices (which may include an active device and/or a passive device) could be increased because a number of input/output members can be transferred to the top surface 10t of the substrate 10.

The patterned conductive layer 14 is disposed on the top surface 23t of the encapsulant 23. The patterned conductive layer 14 is disposed on the lateral surface 23s1 and 23s3 of the encapsulant 23. The patterned conductive layer 14 extends from the top surface 23t of the encapsulant 23 to the lateral surfaces 23s1 and 23s3 of the encapsulant 23. The patterned conductive layer 14 may be in contact with the electronic component 12 or 15. The patterned conductive layer 14 constitutes at least two separate conductive paths on the top surface 23t and the lateral surface 23s1 or 23s3 of the encapsulant 23.

FIG. 4A through FIG. 4H illustrate some embodiments of a method of manufacturing the semiconductor package structure 1 according to some embodiments of the present disclosure. The series of operations of the method relate to unit-type PVD operations.

Referring to FIG. 4A, a method for manufacturing the semiconductor package structure 1 includes providing a substrate 10 with a conductive element 101. The conductive element 101 may be a conductive via or an interconnection element. The substrate 10 includes a top surface 10t and a bottom surface 10b opposite the top surface 10t. The substrate 10 includes a lateral surface 10s angled to the top surface 10t and the bottom surface 10b. The lateral surface 10s may be perpendicular to the top surface 10t and the bottom surface 10b. An electrical contact 18 is disposed on the bottom surface 10b of the substrate 10. The electrical contact 18 may be a solder ball.

Referring to FIG. 4B, an electronic component 17 is disposed on the bottom surface 10b of the substrate 10. The electronic component 17 may include a chip or a die including a semiconductor substrate, one or more integrated circuit devices and/or one or more overlying interconnection structures therein. The electronic component 17 may include conductive wires electrically connected to the conductive element 101 of the substrate 10. An encapsulant 13a is disposed on the bottom surface 10b of the substrate 10 to encapsulate the electronic component 17 and the electrical contact 18. The encapsulant 13a completely covers the bottom surface 10b of the substrate 10.

Referring to FIG. 4C, an electronic component 11 and an electronic component 12 are disposed on the top surface 10t of the substrate 10. An encapsulant 13 is disposed on the top surface 10t of the substrate 10 to encapsulate the electronic components 11 and 12. The encapsulant 13 completely covers the top surface 10t of the substrate 10.

The electronic component 11 may include a chip or a die including a semiconductor substrate, one or more integrated circuit devices and/or one or more overlying interconnection structures therein. The integrated circuit devices may include active devices such as transistors and/or passive devices such as resistors, capacitors, inductors, or a combination thereof. The electronic component 11 is a flip-chip type semiconductor device. In some embodiments, the electronic component 11 may be a wire-bond type semiconductor device. The electronic component 12 is a passive device such as a resistor, a capacitor, an inductor, or a combination thereof.

Referring to FIG. 4D, a grinding operation is performed. The encapsulant 13 on the top surface 10t of the substrate 10 is ground by the grinding operation. The encapsulant 13a on the bottom surface 10b of the substrate 10 is ground to expose the electrical contact 18.

After the grinding operation, the encapsulant 13 includes a top surface 13t and a lateral surface 13s angled to the top surface 13t. The lateral surface 13s may be perpendicular to the top surface 13t. The lateral surface 13s of the encapsulant 13 and the lateral surface 10s of the substrate 10 are substantially coplanar with each other. The lateral surface of the encapsulant 13a and the lateral surface 10s of the substrate 10 are substantially coplanar with each other.

Figure 4E:
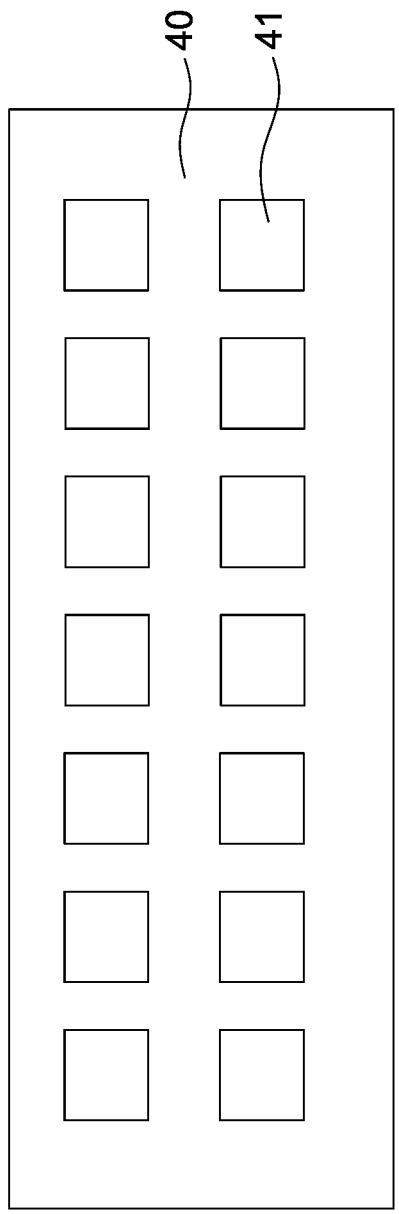
FIG. 4E illustrates a method of manufacturing a semiconductor package structure according to some embodiments of the present disclosure.

Referring to FIG. 4E, after the grinding operation, a singulation operation is performed. Each unit 41 is picked by a carrier 40.

Figure 4F:
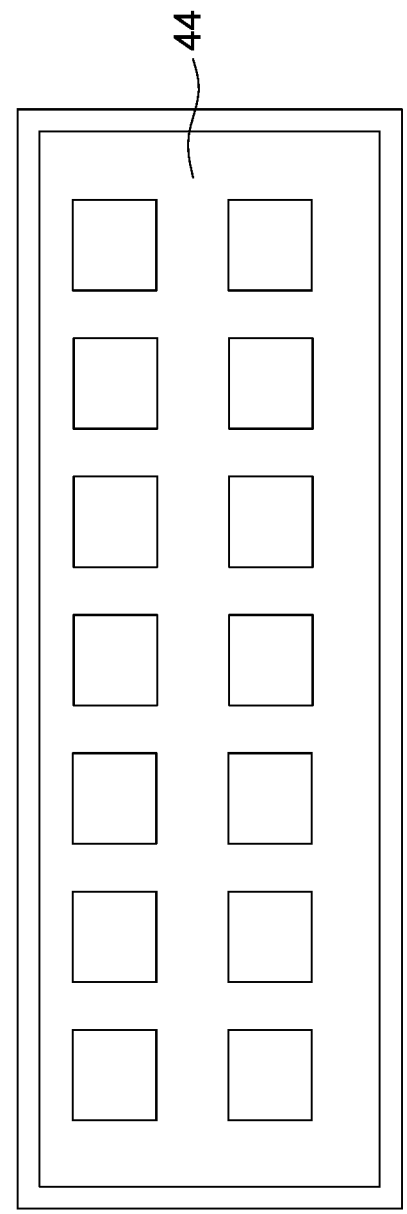
FIG. 4F illustrates a method of manufacturing a semiconductor package structure according to some embodiments of the present disclosure.

Referring to FIG. 4F, a PVD deposition operation is performed. A conductive layer 44 is formed on the encapsulant 13 of each unit 41 on the carrier 40. The conductive layer 44 may be a sputtered metal layer. The conductive layer 44 may be a sputtered Cu layer. The conductive layer 44 may include Cu, Au, an alloy of the same, or other suitable materials. The conductive layer 44 is deposited on the encapsulant 13 and the substrate 10. The conductive layer 44 is formed on the top surface 13t and the lateral surface 13s of the encapsulant 13. The conductive layer 44 is formed on the lateral surface 10s of the substrate 10.

Compared with an electroplating operation (e.g., Cu formed by the electroplating operation), a quality of the PVD-deposited conductive layer would be better than a quality of a conductive layer formed by the electroplating operation. Since the PVD deposition operation relates to a dry operation, the reliability of the PVD-deposited conductive layer would be also better than the reliability of the conductive layer formed by the electroplating operation. In addition, the deposition rate of the PVD deposition operation is faster than the deposition rate of the electroplating operation. It is not necessary to further perform a grinding operation for the conductive layer 44.

Figure 4G:
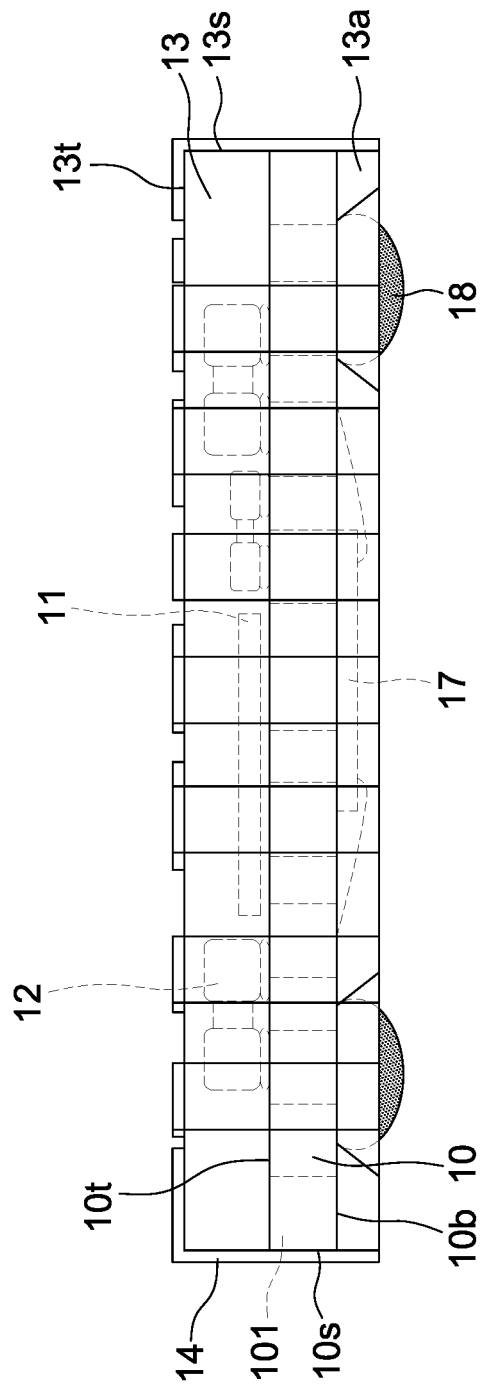
FIG. 4G illustrates a method of manufacturing a semiconductor package structure according to some embodiments of the present disclosure.

Referring to FIG. 4G, the conductive layer 44 on each unit is patterned by a removing operation to form a patterned conductive layer 14. The removing operation may be a laser polishing operation, an etching operation, or other suitable operations. The conductive layer 44 on the encapsulant 13 and the substrate 10 is patterned by the laser polishing operation. The patterned conductive layer 14 constitutes at least two separate conductive paths on the encapsulant 13 of each unit. The patterned conductive layer 14 constitutes at least two separate conductive paths on the encapsulant 13 and the substrate 10 of each unit. A laser power may be adjusted based on need. A patterned shape of the conductive layer 44 may be adjusted by the laser polishing operation. An outermost surface of the encapsulant 13 may be damaged by the laser polishing operation.

In some embodiments, the conductive layer 44 on each unit may be patterned by an etching operation to form the patterned conductive layer 14.

The patterned conductive layer 14 is disposed on the encapsulant 13. The patterned conductive layer 14 is disposed and extends on the top surface 13t of the encapsulant 13. The patterned conductive layer 14 protrudes from the top surface 13t of the encapsulant 13. The patterned conductive layer 14 is disposed and extends on the lateral surface 13s of the encapsulant 13. The patterned conductive layer 14 protrudes from the lateral surface 13s of the encapsulant 13. The patterned conductive layer 14 is disposed and extends on the lateral surface 10s of the substrate 10. The patterned conductive layer 14 protrudes from the lateral surface 10s of the substrate 10. The patterned conductive layer 14 is electrically connected to the conductive element 101 of the substrate 10. The patterned conductive layer 14 protrudes from a lateral surface of the encapsulant 13a.

Figure 4H:
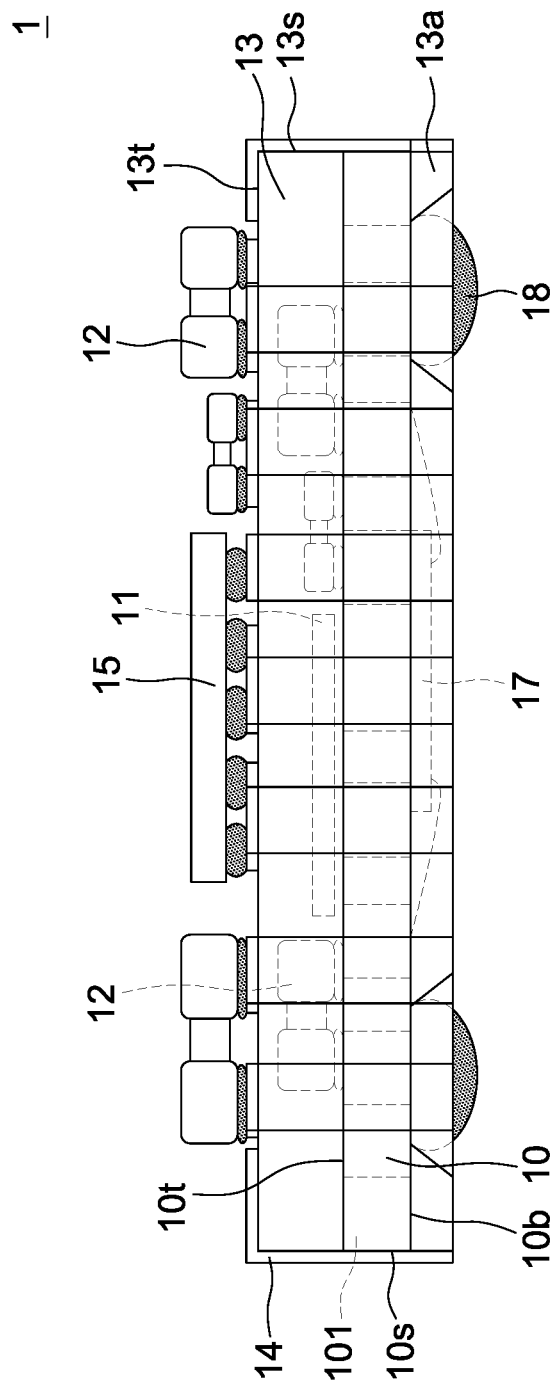
FIG. 4H illustrates a method of manufacturing a semiconductor package structure according to some embodiments of the present disclosure.

Referring to FIG. 4H, an electronic component 12 and an electronic component 15 are disposed on the top surface 13t of the encapsulant 13 so as to form the semiconductor package structure 1.

The electronic component 15 is a flip-chip type semiconductor device. In some embodiments, the electronic component 15 may be a wire-bond type semiconductor device. The electronic components 12 and 15 are electrically connected to the patterned conductive layer 14. The patterned conductive layer 14 provides conductive paths for the substrate 10 and the electronic components 11, 12, 15, and 17.

FIG. 5A through FIG. 5G illustrate some embodiments of a method of manufacturing the substrate 2 according to some embodiments of the present disclosure. The series of operations of the method relate to strip-type PVD operations.

Referring to FIG. 5A, a method for manufacturing the semiconductor package structure 2 includes providing a substrate 10 with a conductive element 101. The conductive element 101 may be a conductive via or an interconnection element. The substrate 10 includes a top surface 10t and a bottom surface 10b opposite the top surface 10t. The substrate 10 includes a lateral surface 10s angled to the top surface 10t and the bottom surface 10b. The lateral surface 10s may be perpendicular to the top surface 10t and the bottom surface 10b. An electrical contact 18 is disposed on the bottom surface 10b of the substrate 10. The electrical contact 18 may be a solder ball.

Referring to FIG. 5B, an electronic component 17 is disposed on the bottom surface 10b of the substrate 10. The electronic component 17 may include a chip or a die including a semiconductor substrate, one or more integrated circuit devices and/or one or more overlying interconnection structures therein. The electronic component 17 may include conductive wires electrically connected to the conductive element 101 of the substrate 10. An encapsulant 13a is disposed on the bottom surface 10b of the substrate 10 to encapsulate the electronic component 17 and the electrical contact 18. The encapsulant 13a completely covers the bottom surface 10b of the substrate 10.

Referring to FIG. 5C, an electronic component 11 and an electronic component 12 are disposed on the top surface 10t of the substrate 10. An encapsulant 23 is disposed on the top surface 10t of the substrate 10 to encapsulate the electronic components 11 and 12. The encapsulant 23 partially covers the top surface 10t of the substrate 10.

The electronic component 11 may include a chip or a die including a semiconductor substrate, one or more integrated circuit devices and/or one or more overlying interconnection structures therein. The integrated circuit devices may include active devices such as transistors and/or passive devices such as resistors, capacitors, inductors, or a combination thereof. The electronic component 11 is a flip-chip type semiconductor device. In some embodiments, the electronic component 11 may be a wire-bond type semiconductor device. The electronic component 12 is a passive device such as a resistor, a capacitor, an inductor, or a combination thereof.

Referring to FIG. 5D, a grinding operation is performed. The encapsulant 23 on the top surface 10t of the substrate 10 is ground by the grinding operation. The encapsulant 23 on the bottom surface 10b of the substrate 10 is ground to expose the electrical contact 18.

After the grinding operation, the encapsulant 23 includes a top surface 23t and a lateral surface 23s angled to the top surface 23t. The lateral surface 23s may be perpendicular to the top surface 23t. The lateral surface 23s of the encapsulant 23 is spaced from the lateral surface 10s of the substrate 10 by a distance. The distance may be adjusted based on need.

Figure 5E:
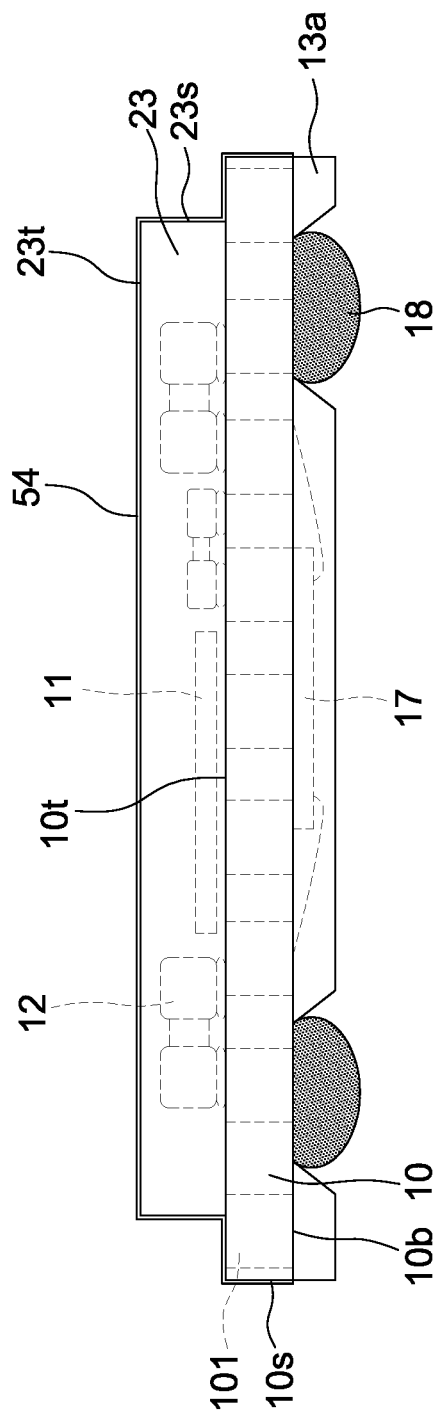
FIG. 5E illustrates a method of manufacturing a semiconductor package structure according to some embodiments of the present disclosure.

Referring to FIG. 5E, a PVD deposition operation is performed. A conductive layer 54 is formed on the encapsulant 23. The conductive layer 54 may be a sputtered metal layer. The conductive layer 54 may be a sputtered Cu layer. The conductive layer 54 may include Cu, Au, an alloy of the same, or other suitable materials. The conductive layer 54 is deposited on the encapsulant 23 and the substrate 10. The conductive layer 54 is formed on the top surface 23t and the lateral surface 23s of the encapsulant 23. The conductive layer 54 is formed on the lateral surface 10s of the substrate 10.

Figure 5F:
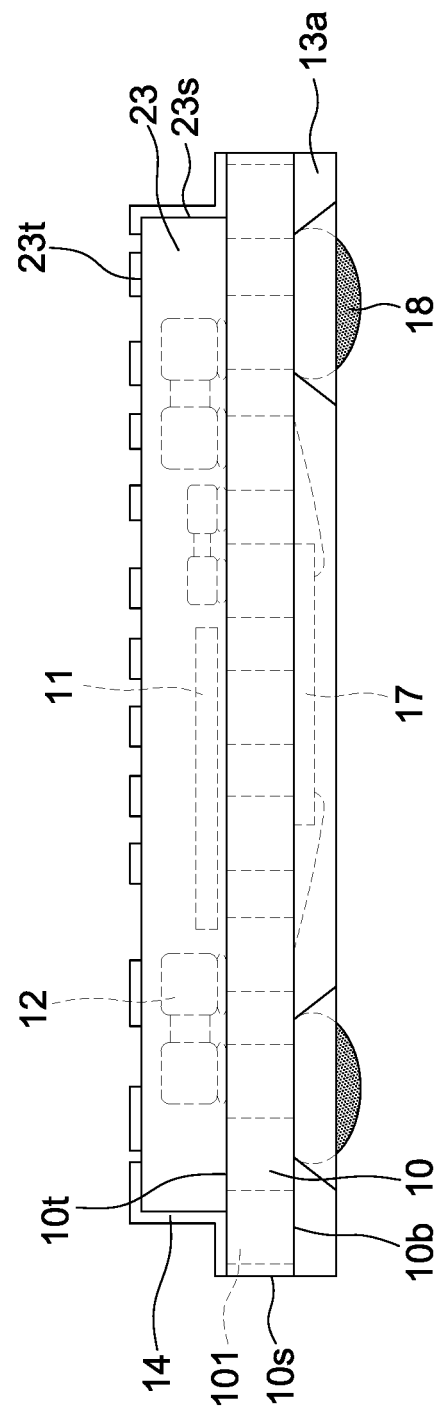
FIG. 5F illustrates a method of manufacturing a semiconductor package structure according to some embodiments of the present disclosure.

Referring to FIG. 5F, the conductive layer 54 is patterned by a removing operation to form a patterned conductive layer 14. The removing operation may be a laser polishing operation, an etching operation, or other suitable operations. The conductive layer 54 on the encapsulant 23 and the substrate 10 is patterned by the laser polishing operation. The patterned conductive layer 14 constitutes at least two separate conductive paths on the encapsulant 23 of each unit. The patterned conductive layer 14 constitutes at least two separate conductive paths on the encapsulant 23 and the substrate 10 of each unit. A laser power may be adjusted based on need. A patterned shape of the conductive layer 54 may be adjusted by the laser polishing operation. An outermost surface of the encapsulant 23 may be damaged by the laser polishing operation.

The patterned conductive layer 14 is disposed on the encapsulant 23. The patterned conductive layer 14 is disposed and extends on the top surface 23t of the encapsulant 23. The patterned conductive layer 14 protrudes from the top surface 23t of the encapsulant 23. The patterned conductive layer 14 is disposed and extends on the lateral surface 23s of the encapsulant 23. The patterned conductive layer 14 protrudes from the lateral surface 23s of the encapsulant 23. The patterned conductive layer 14 is disposed and extends on the top surface 10t of the substrate 10. The patterned conductive layer 14 protrudes from the top surface 10t of the substrate 10. The patterned conductive layer 14 is electrically connected to the conductive element 101 of the substrate 10.

Figure 5G:
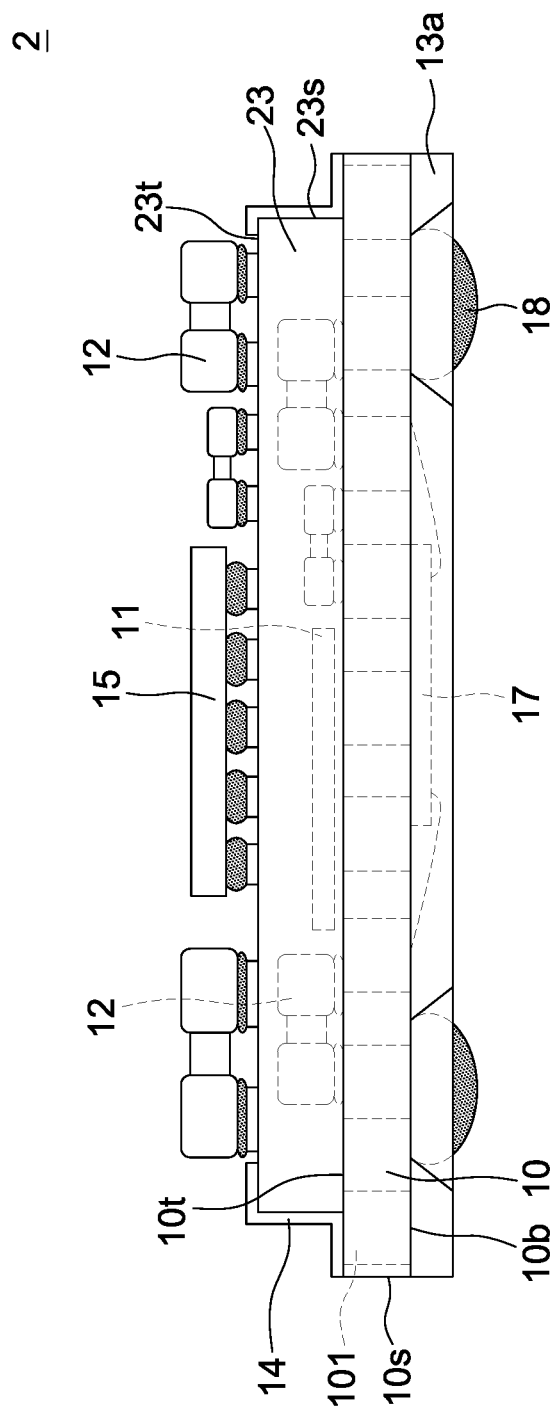
FIG. 5G illustrates a method of manufacturing a semiconductor package structure according to some embodiments of the present disclosure.

Referring to FIG. 5G, an electronic component 12 and an electronic component 15 are disposed on the top surface 23t of the encapsulant 23. Subsequently, a singulation operation is performed to form the semiconductor package structure 2.

The electronic component 15 is a flip-chip type semiconductor device. In some embodiments, the electronic component 15 may be a wire-bond type semiconductor device. The electronic components 12 and 15 are electrically connected to the patterned conductive layer 14. The patterned conductive layer 14 provides conductive paths for the substrate 10 and the electronic components 11, 12, 15, and 17.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
a substrate including a first surface;

a first encapsulant covering the first surface of the substrate and including an upper surface and a lateral side surface;
a patterned conductive layer extending on the upper surface and the lateral side surface of the first encapsulant; and
a first electronic component disposed on the patterned conductive layer; and
a second electronic component encapsulated by the first encapsulant and electrically connected to the first electronic component through the substrate and the patterned conductive layer,
wherein the substrate includes a second surface opposite to the first surface,
wherein the semiconductor package structure further comprises a third electronic component connected to the substrate through the second surface of the substrate, and
wherein the third electronic component is electrically connected to the first electronic component through the patterned conductive layer.

2. The semiconductor package structure of claim 1,
wherein the first encapsulant includes a lower surface opposite to the upper surface, and
wherein the patterned conductive layer includes a first portion disposed on the lateral side surface of the first encapsulant, and the first portion includes a lateral side surface non-perpendicular to the upper surface of the first encapsulant from a front view.

3. The semiconductor package structure of claim 2, wherein a width of the first portion tapers towards the upper surface of the first encapsulant.

4. The semiconductor package structure of claim 3,
wherein the substrate includes a lateral side surface and a second surface opposite to the first surface,
wherein the semiconductor package structure further comprises a second encapsulant connected to the second surface of the substrate, and
wherein the first portion is continuously disposed on the lateral side surface of the substrate and a lateral side surface of the second encapsulant.

5. The semiconductor package structure of claim 1, further comprising a second encapsulant encapsulating the third electronic component and in contact with the second surface of the substrate.

6. The semiconductor package structure of claim 5,
wherein the substrate includes a lateral side surface extending between the first surface and the second surface, and
wherein the patterned conductive layer is continuously disposed on the lateral side surface of the first encapsulant, the lateral side surface of the substrate, and a lateral side surface of the second encapsulant.

7. A semiconductor package structure, comprising:
a circuit structure;
an encapsulant connected to the circuit structure and including an upper surface and a first lateral side surface;
a plurality of first patterned conductive layers disposed on the upper surface and the first lateral side surface of the encapsulant and separated from each other; and
a first electronic component disposed over the encapsulant and electrically connected to the circuit structure through the plurality of first patterned conductive layers,
wherein a portion of the first lateral side surface of the encapsulant is exposed by the plurality of first patterned conductive layers.

8. The semiconductor package structure of claim 7, further comprising:
a plurality of second patterned conductive layers disposed on the upper surface and the first lateral side surface of the encapsulant, and
a second electronic component disposed over the encapsulant and electrically connected to the circuit structure through the plurality of second patterned conductive layers.

9. The semiconductor package structure of claim 8, wherein a width of the plurality of first patterned conductive layers and a width of the plurality of second patterned conductive layers are different from a top view.

10. The semiconductor package structure of claim 8, wherein the plurality of second patterned conductive layers are not electrically connected to the plurality of first patterned conductive layers.

11. The semiconductor package structure of claim 7, wherein the encapsulant comprises a second lateral side surface opposite to the first lateral side surface, and wherein the semiconductor package structure comprises:
a plurality of third patterned conductive layers disposed on the upper surface and the second lateral side surface of the encapsulant, and
a third electronic component disposed over the encapsulant and electrically connected to the circuit structure through the plurality of third patterned conductive layers.

12. The semiconductor package structure of claim 11, wherein a pitch of the plurality of first patterned conductive layers and a pitch of the plurality of third patterned conductive layers are different from a top view.

13. The semiconductor package structure of claim 11, wherein a portion of the second lateral side surface of the encapsulant is exposed by the plurality of third patterned conductive layers.

14. The semiconductor package structure of claim 7, wherein one of the plurality of first patterned conductive layers includes a first portion and a second portion disposed on the upper surface of the encapsulant, wherein a first extension direction of the first portion is substantially perpendicular to a second extension direction of the second portion from a top view.

15. The semiconductor package structure of claim 14, wherein a width of the first portion and a width of the second portion are different.

16. A semiconductor package structure, comprising:
a circuit structure;
an encapsulant connected to the circuit structure and including an upper surface and a first lateral side surface;
a plurality of first patterned conductive layers disposed on the upper surface and the first lateral side surface of the encapsulant and separated from each other; and
a first electronic component disposed over the encapsulant and electrically connected to the circuit structure through the plurality of first patterned conductive layers,
wherein the plurality of first patterned conductive layers include at least two different widths from a top view.

17. A semiconductor package structure, comprising:
a substrate including a first surface;

a first encapsulant covering the first surface of the substrate and including an upper surface and a lateral side surface;
a patterned conductive layer extending on the upper surface and the lateral side surface of the first encapsulant; and
a first electronic component disposed on the patterned conductive layer; and
a second electronic component encapsulated by the first encapsulant and electrically connected to the first electronic component through the substrate and the patterned conductive layer,
wherein the patterned conductive layer includes a second portion disposed on the upper surface of the first encapsulant, and
wherein the second portion includes a first lateral side surface and a first recess recessed from the first lateral side surface from a cross-sectional view.

18. The semiconductor package structure of claim 17, wherein the second portion includes a second lateral side surface opposite to the first lateral side surface and a second recess recessed from the second lateral side surface from the cross-sectional view.

* * * * *